(12) United States Patent
Cheng

(10) Patent No.: US 9,167,060 B2
(45) Date of Patent: Oct. 20, 2015

(54) MOBILE PHONE HOUSING WITH TOOL FRAME

(71) Applicant: Lucent Trans Electronic Co., Ltd., New Taipei (TW)

(72) Inventor: Chin-Hung Cheng, New Taipei (TW)

(73) Assignee: Lucent Trans Electronic Co., Ltd., New Taipei (TW)

( * ) Notice: Subject to any disclaimer, the term of this patent is extended or adjusted under 35 U.S.C. 154(b) by 82 days.

(21) Appl. No.: 14/098,812

(22) Filed: Dec. 6, 2013

(65) Prior Publication Data

US 2015/0163934 A1 Jun. 11, 2015

(51) Int. Cl.
*H04M 1/02* (2006.01)
*H05K 5/02* (2006.01)
*H05K 5/00* (2006.01)
*H05K 5/03* (2006.01)

(52) U.S. Cl.
CPC ........... *H04M 1/0202* (2013.01); *H05K 5/0086* (2013.01); *H05K 5/02* (2013.01); *H05K 5/0217* (2013.01); *H05K 5/03* (2013.01)

(58) Field of Classification Search
None
See application file for complete search history.

(56) References Cited

U.S. PATENT DOCUMENTS

2013/0188122 A1* 7/2013 Daole ........................... 351/158
2015/0008148 A1* 1/2015 Shelton ......................... 206/234

* cited by examiner

*Primary Examiner* — Charles Appiah
*Assistant Examiner* — Margaret G Mastrodonato
(74) *Attorney, Agent, or Firm* — patenttm.us

(57) ABSTRACT

A mobile phone housing with a tool frame has a main casing, a tool frame slidably mounted in the main casing, and a slider connected to the tool frame. By pushing the slider, the tool frame can be driven to protrude out of the mobile phone housing or to be stored in the mobile phone housing. The tool frame may be an eyeglasses frame for mounting glasses. The glasses mounted in the tool frame can be replaced with other glasses of different lens prescriptions or different functions according to user's need, such that the mobile phone housing with the eyeglasses frame is convenient for people with eye defects to use. Or the tool frame may be a mirror frame for mounting the mirror to allow user to look at himself in the mirror.

11 Claims, 8 Drawing Sheets

MOBILE PHONE HOUSING WITH TOOL FRAME

BACKGROUND OF THE INVENTION

1. Field of the Invention

The present invention relates to a mobile phone housing, especially to a mobile phone housing with a tool frame.

2. Description of the Prior Art(s)

With progress of communication technology, mobile phones have become necessities to contemporary people. Besides young people who always carry the mobile phones with them, the middle-aged and elderly people are also deeply attached to convenience of the mobile phones and use the mobile phones all the time.

For instance, since more and more young people are nearsighted and a large proportion of the middle-aged and elderly people have presbyopia, eyeglasses have long been necessities to both nearsighted and presbyopic people. However, people with mild nearsightedness or mild presbyopia do not need to wear eyeglasses all the time. Thus, whenever the people need the eyeglasses, they might not find one immediately available at hand.

To overcome the shortcomings, the present invention provides a mobile phone housing with a tool frame to mitigate or obviate the aforementioned problems.

SUMMARY OF THE INVENTION

The main objective of the present invention is to provide a mobile phone housing with a tool frame. The mobile phone housing has a main casing, a tool frame slidably mounted in the main casing, and a slider connected to the tool frame.

By pushing the slider, the tool frame can be driven to protrude out of the mobile phone housing or to be stored in the mobile phone housing. The tool frame may be an eyeglasses frame for mounting glasses. The glasses mounted in the tool frame can be replaced with other glasses of different lens prescriptions or different functions according to user's need, such that the mobile phone housing with the tool frame is convenient for people with eyes defects to use. Or the tool frame may be a mirror frame for mounting the mirror 28' to allow user to look at himself in the mirror.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
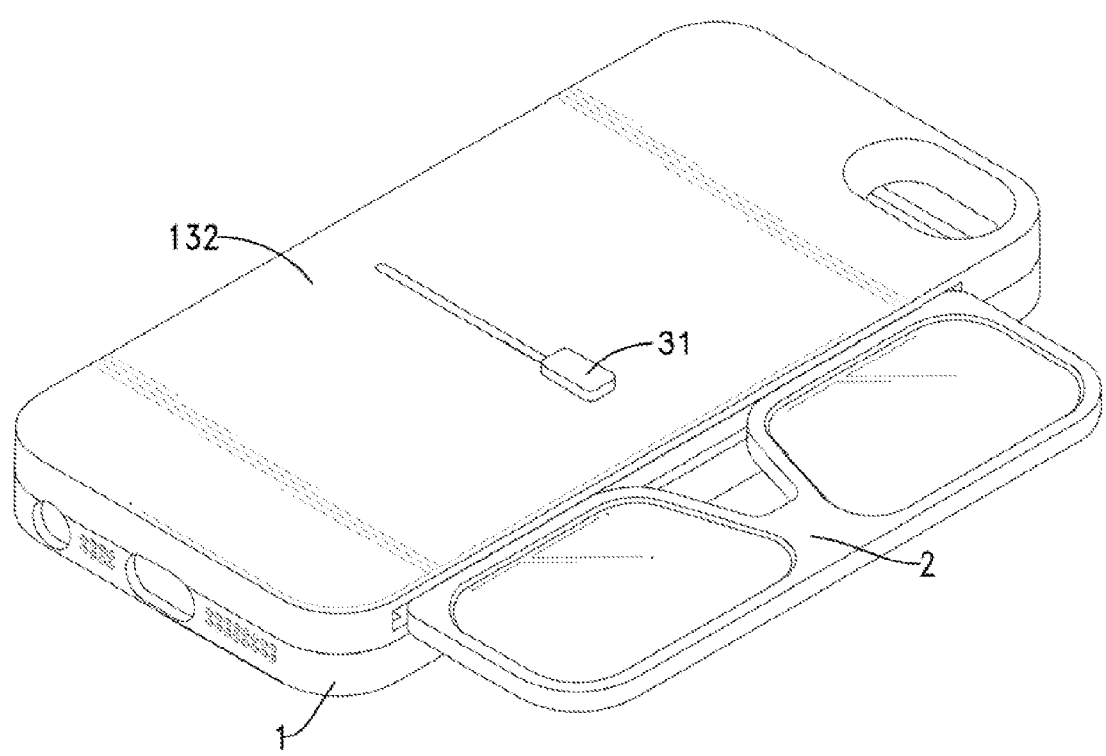
FIG. 1 is a perspective view of a first embodiment of a mobile phone housing with a tool frame in accordance with the present invention.
Figure 5:
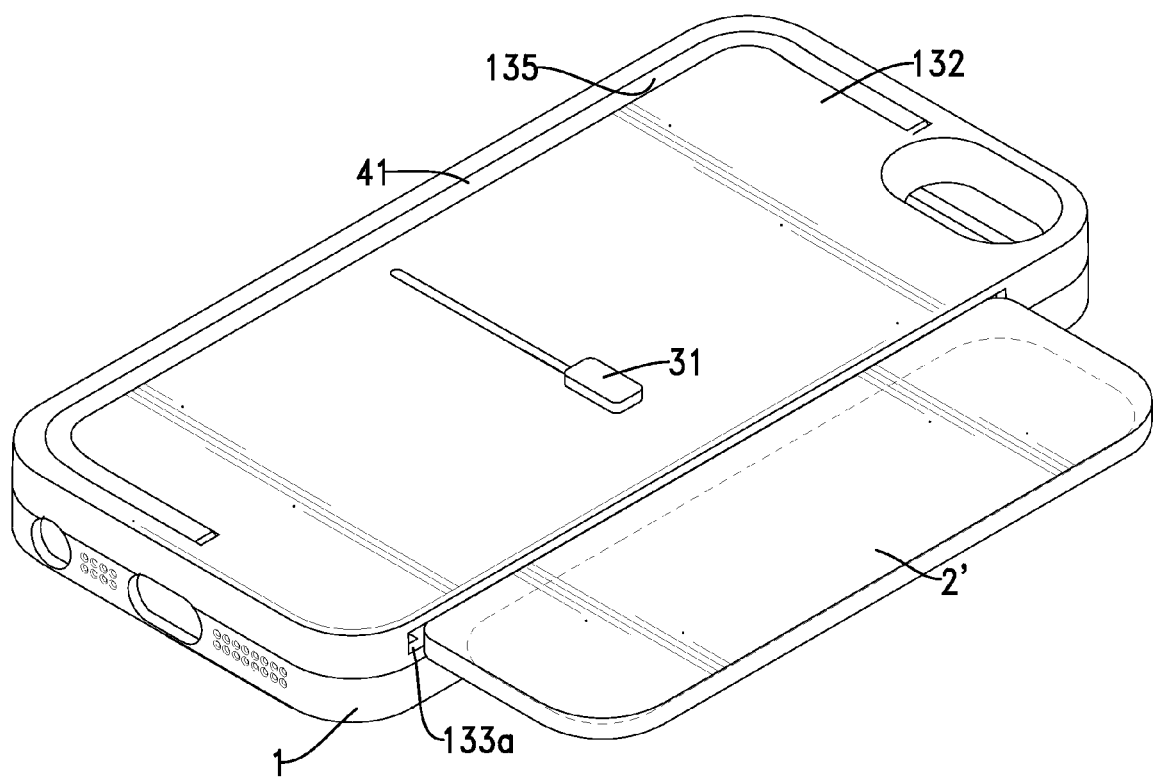
FIG. 5 is a perspective view of a second embodiment of a mobile phone housing with a tool frame in accordance with the present invention.

With reference to FIGS. 1 and 5, a mobile phone housing with a tool frame in accordance with the present invention comprises a main housing 1, a tool frame 2, 2', and a slider 31.

Figure 2:
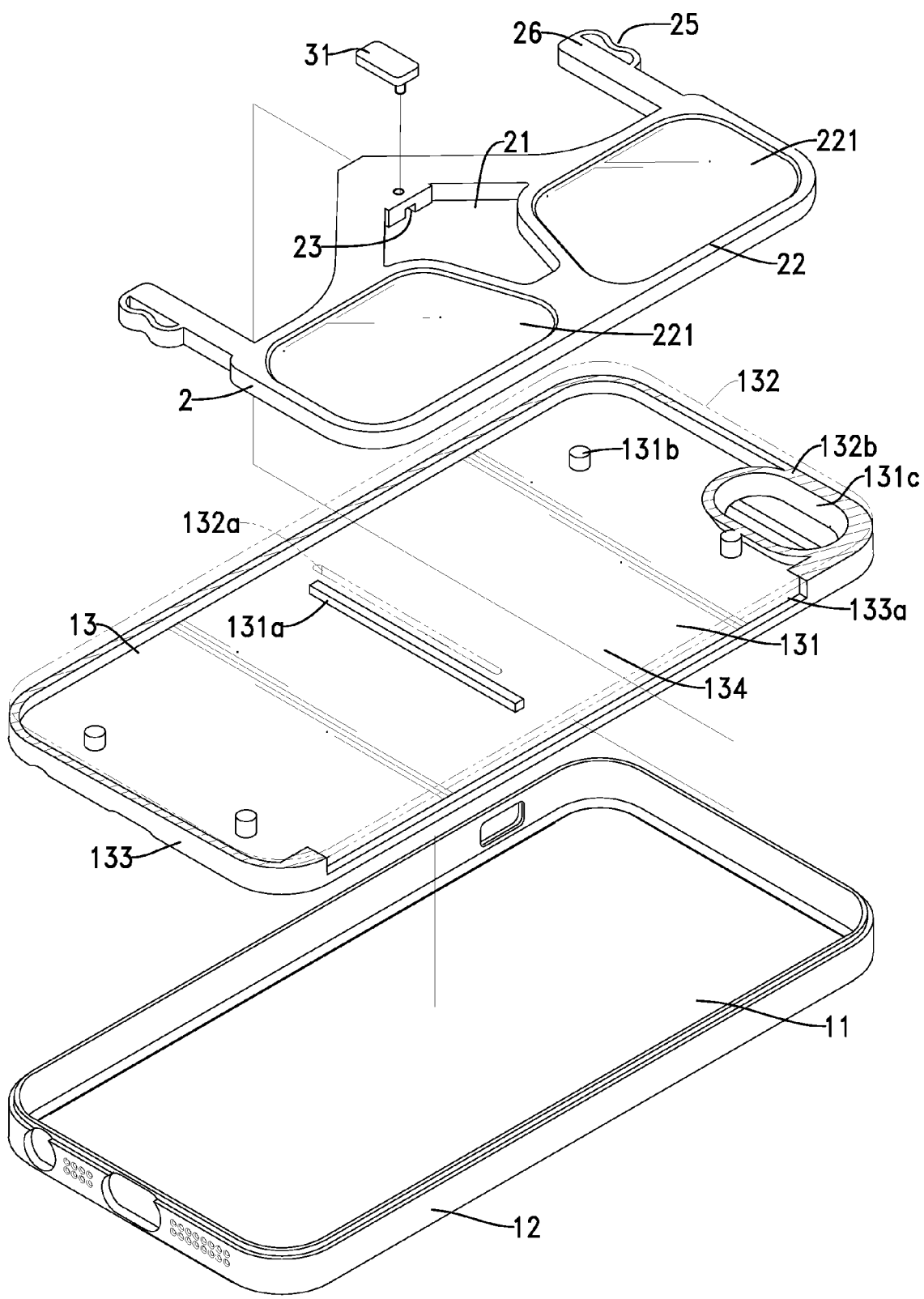
FIG. 2 is an exploded perspective view of the first embodiment of the mobile phone housing in FIG. 1.
Figure 3A:
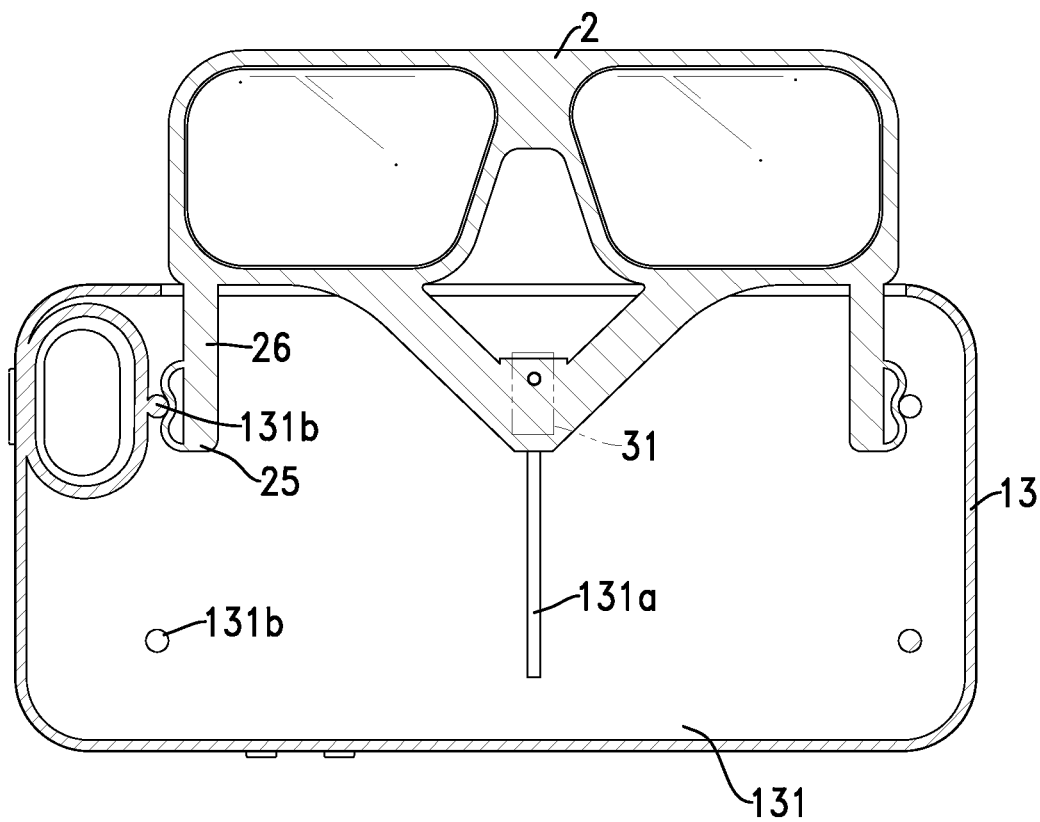
FIG. 3A is a cross-sectional side view of the first embodiment of the mobile phone housing in FIG. 1.
Figure 3B:
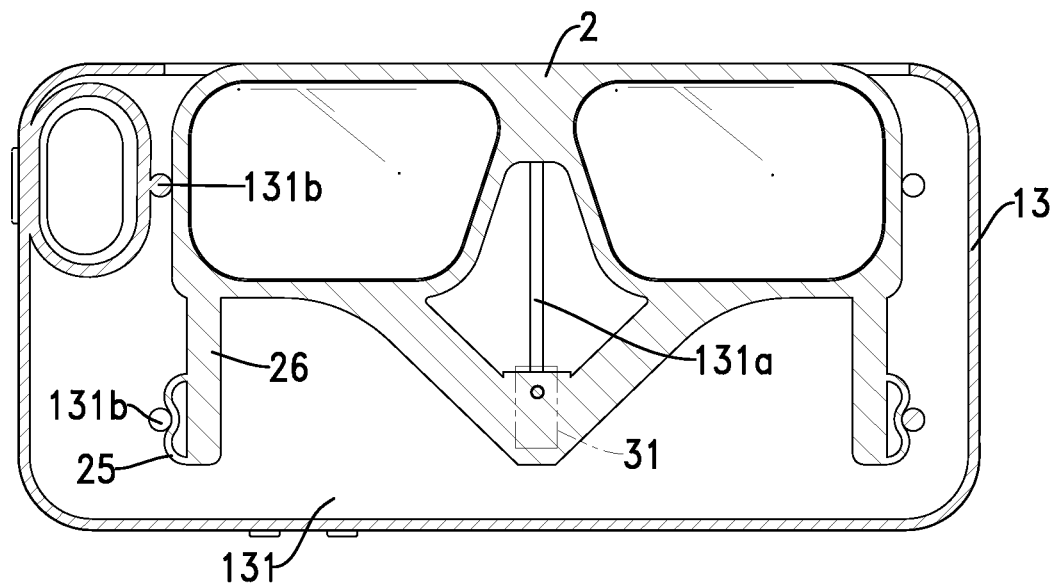
FIG. 3B is an operational side view of the first embodiment of the mobile phone housing in FIG. 1.
Figure 4:
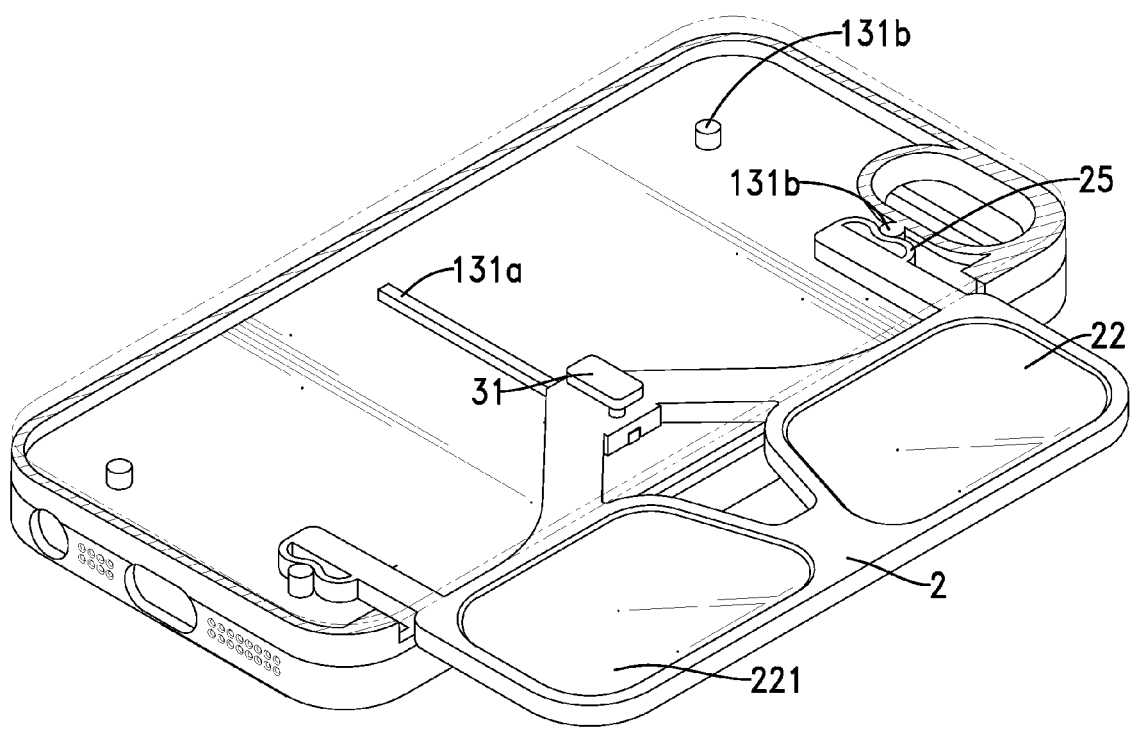
FIG. 4 is a perspective view in partial section of the first embodiment of the mobile phone housing in FIG. 1.
Figure 6:
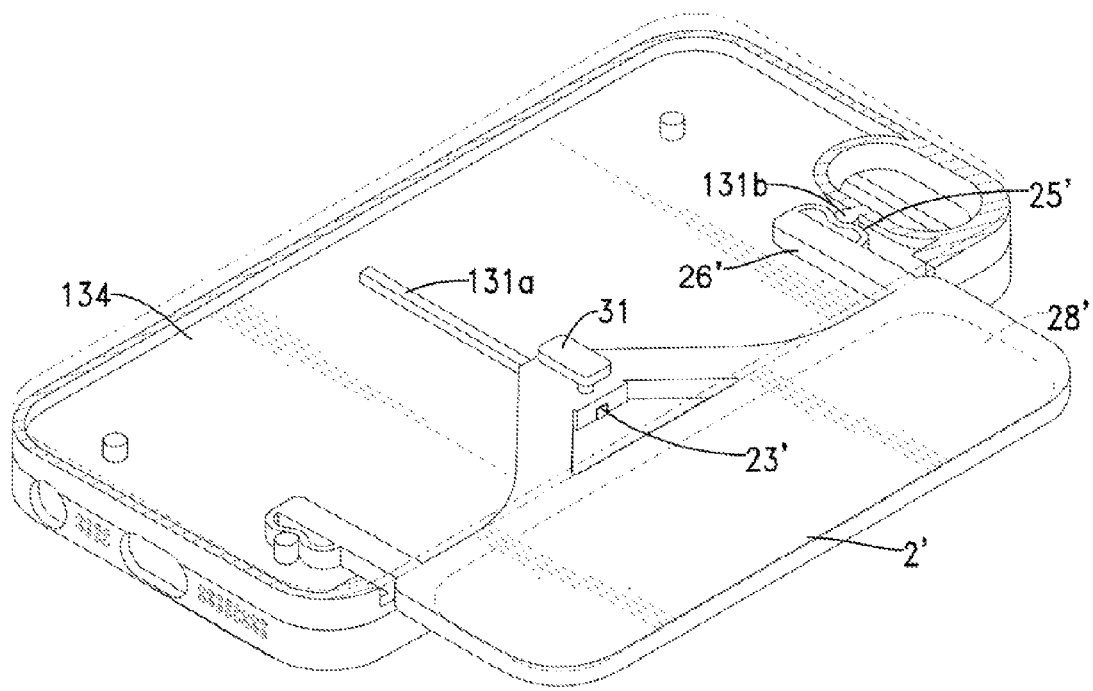
FIG. 6 is a perspective view in partial section of the second embodiment of the mobile phone housing in FIG. 5.

With further reference to FIGS. 2, 4, and 6, the main housing 1 has a base casing 12, a mounting recess 11, and a tool casing 13. The base casing 12 has an open top. The mounting recess 11 is formed in the main housing 1 and is formed in the base casing 12 of the main housing 1 for receiving a mobile communication module, a camera module, and the like. The tool casing 13 is mounted on the open top of the base casing 12, is attached to the base casing 12, and has a partition panel 131, a top panel 132, a peripheral wall 133, and a storing chamber 134.

The partition panel 131 is mounted on the open top of the base casing 12 and is attached to the base casing 12. The partition panel 131 has a peripheral edge, an inner surface, a guiding track 131a, two pairs of positioning protrusions 131b, and a lens aperture 131c. The inner surface of the partition panel 131 is opposite to the open top of the base casing 12. The guiding track 131a is formed on the inner surface of the partition panel 131 and has two opposite ends. The pairs of the positioning protrusions 131b are separately formed on and protrude from the inner surface of the partition panel 131, and respectively correspond in position to the ends of the guiding track 131a. The positioning protrusions 131b of each pair are respectively disposed oppositely beside the guiding track 131a. The lens aperture 131c of the partition panel 131 corresponds in position to lens of the camera module.

The top panel 132 is disposed above and is separated from the partition panel 131. The top panel 132 has a peripheral edge, a guiding slot 132a, and a lens aperture 132b. The guiding slot 132a corresponds in position to the guiding track 131a. The lens aperture 132b of the top panel 132 corresponds in position to the lens aperture 131c of the positioning panel 131.

The peripheral wall 133 is formed around and is attached to the peripheral edges of the partition panel 131 and of the top panel 132. The peripheral wall 133 has a side hole 133a. The side hole 133a is elongated and extends perpendicular to the guiding track 131a.

The storing chamber 134 is defined between the partition panel 131 and the top panel 132.

With further reference to FIGS. 3A, 3B, 5 and 6, the tool frame 2, 2' is slidably mounted in the main housing 1 and is disposed opposite to the mounting recess 11 of the main housing 1. Specifically, the tool frame 2, 2' is slidably mounted in the storing chamber 134 of the tool casing 13, is disposed between the positioning protrusions 131b of each pair, and is selectively stored in the storing chamber 134 of the tool casing 13. The tool frame 2, 2' has a front, a rear, a guiding groove 23, 23', and two temples 26, 26'.

The front of the tool frame 2, 2' faces the side hole 133a of the tool casing 13 when the tool frame 2, 2' is stored in the tool casing 13. The rear of the tool frame 2, 2' is opposite to the front of the tool frame 2, 2'.

The guiding groove 23, 23' is formed in the tool frame 2, 2', and extends parallel to and engages the guiding track 131a of the tool casing 13. Thus, the tool frame 2, 2' slides along the guiding track 131a smoothly and stably.

As shown in FIGS. 3A, 3B, 5 and 6, the temples 26, 26' separately protrude from the rear of the frame 2, 2'. Each temple 26, 26' has an engaging structure 25, 25'. The engaging structures 25, 25' of the two temples 26, 26' each respectively engage one of the pairs of the positioning protrusions 131b. Specifically, each of the engaging structures 25, 25' of the tool frame 2, 2' is a resilient panel having a recessed portion. The recessed portions of the engaging structures 25, 25' of the tool frame 2, 2' each selectively engage or disengage from one of the pairs of the positioning protrusions 131b. Thus, the tool frame 2, 2' alternatively protrudes out of the tool casing 13 through the side hole 133a or is stored in the storing chamber 134 of the tool casing 13.

The slider 31 is connected to the tool frame 2, 2'. Specifically, the slider 31 is mounted outside the tool casing 13 and on the top panel 132, and is connected to the tool frame 2, 2' through the guiding slot 132a of the top panel 132. With the slider 31 sliding in the guiding slot 132a of the top panel 132, a sliding range of the tool frame 2, 2' is limited within the guiding slot 132a. Therefore, the tool frame 2, 2' does not slip off the tool casing 13.

As shown in FIGS. 1 to 4, in a first preferred embodiment, the tool frame 2 is an eyeglasses frame and further has a nose hole 21, two glass holes 22, and two glasses 221. The glass holes 22 are disposed oppositely beside the nose hole 21. The glasses 221 are respectively mounted in the glass holes 22.

With reference to FIG. 4, as the eyeglasses frame 2 protrudes out of the eyeglasses casing 13 through the side hole 133a and the engaging structures 25 of the two temples 26 of the eyeglasses frame 2 each respectively engage one of the pairs of the positioning protrusions 131b, the glasses 221 mounted in the eyeglasses frame 2 can be replaced with other glasses such as nearsighted glasses, farsighted glasses, presbyopic glasses or the like, that have different lens prescriptions or different functions.

Figure 7:
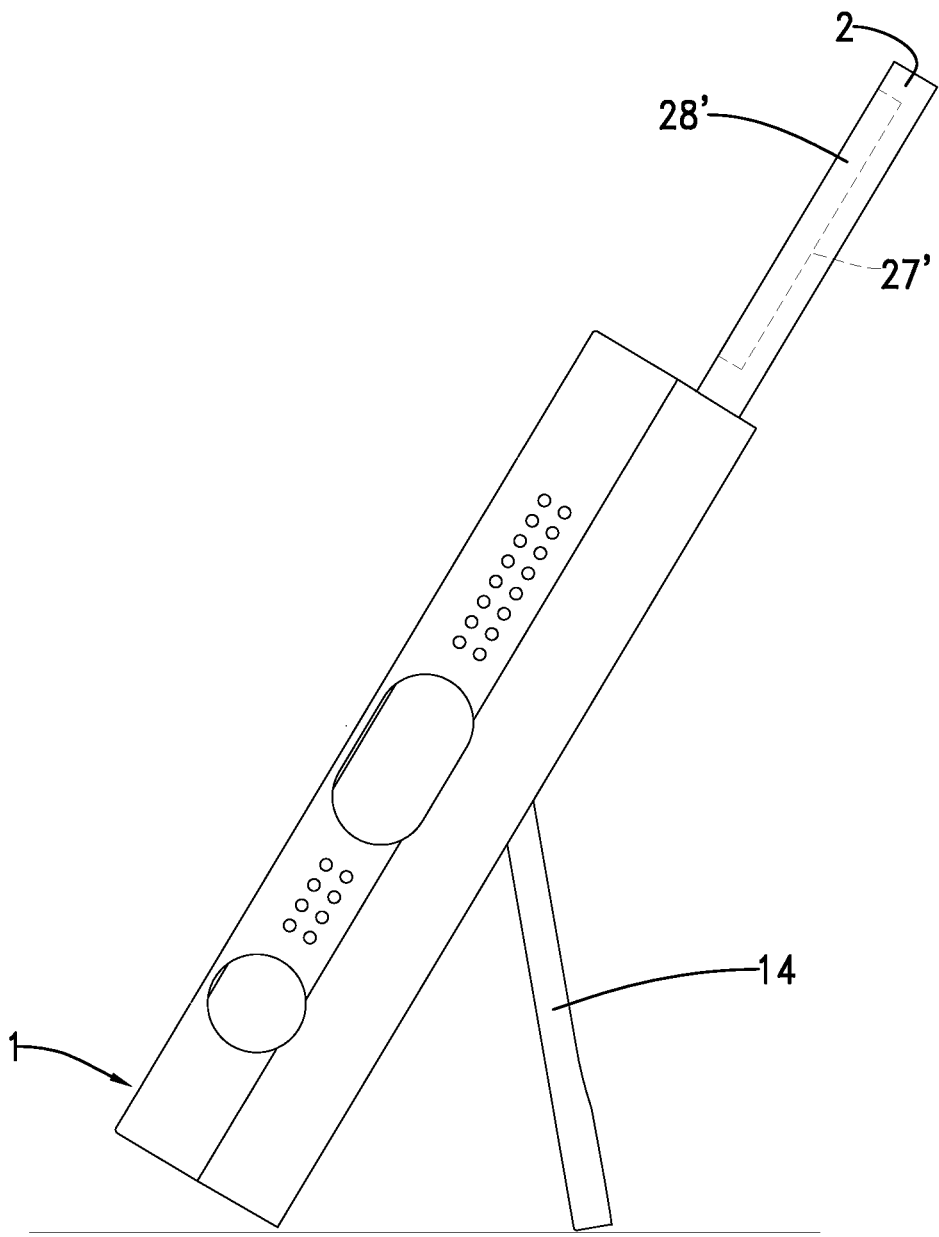
FIG. 7 is an operational side view of the second embodiment of the mobile phone housing in FIG. 5.

With reference to FIGS. 5 to 7, in a second preferred embodiment, the tool frame 2' is a mirror frame and further has a bottom surface, a mirror recess 27' and a mirror 28'. The bottom surface of the tool frame 2' faces the partition panel 131 of the tool casing 13 when the tool frame 2' is stored in the storing chamber 134 of the tool casing 13. The mirror recess 27' is formed in the bottom surface of the tool frame 2'. The mirror 28' is securely mounted in the mirror recess 27'. The top panel 132 of the tool casing 13 further has at least one leg recess 135 formed in an outer surface of the top panel 132. The mobile phone housing further comprises at least one supporting leg 41. The at least one supporting leg 41 is mounted in the at least one leg recess 135 of the top panel 132. Each of the at least one supporting leg 41 has a proximal portion and a distal portion. The proximal portion of each of the at least one supporting leg 41 is pivotally connected to the top panel 132 of the tool casing 13. The distal portion of each of the at least one supporting leg 41 extends away from the side hole 133a of the tool casing 13.

As shown in FIG. 7, when the supporting leg 41 is pivoted to leave the leg recess 135 of the casing 13, the supporting leg 41 can support the mobile phone housing to stand obliquely. Thus, a user can look at himself in the mirror 28'.

The mobile phone housing with the tool frame as described has the following advantages. The tool frame are integrated with the mobile phone housing. By pushing the slider 31, the tool frame 2, 2' can be easily driven to protrude out of the tool casing 13 or to be stored in the tool casing 13. The tool frame 2 may be the eyeglasses frame for mounting the glasses 221. The glasses 221 can be replaced with other glasses of different lens prescriptions or different functions according to user's need, such that the mobile phone housing with the eyeglasses is convenient for people with eyes defects to use. Or the tool frame 2' may be the mirror frame for mounting the mirror 28'. With the supporting leg 41 supporting the mobile phone housing, the user can look at himself in the mirror.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A mobile phone housing comprising:
a main housing having a mounting recess formed in the main housing;
a tool frame slidably mounted in the main housing and disposed opposite to the mounting recess of the main housing; and
a slider connected to the tool frame;
wherein the main housing further has
a base casing having an open top; and
a tool casing mounted on the open top of the base casing and attached to the base casing;
the mounting recess of the main housing is formed in the base casing;
the tool frame is slidably mounted in the tool casing and is selectively stored in the tool casing;
wherein the tool casing has
a partition panel mounted on the open top of the base casing and attached to the base casing;
a top panel disposed above and separated from the partition panel;
a peripheral wall formed around and attached to peripheral edges of the partition panel and of the top panel, and the peripheral wall having a side hole; and
a storing chamber defined between the partition panel and the top panel;
wherein the partition panel of the tool casing has
an inner surface opposite to the open top of the base casing;
a guiding track formed on the inner surface of the partition panel and extending perpendicular to the side hole of the peripheral wall, and the guiding track having two opposite ends; and
two pairs of positioning protrusions separately formed on and protruding from the inner surface of the partition panel, and respectively corresponding in position to the ends of the guiding track, and the positioning protrusions of each pair respectively disposed oppositely beside the guiding track;
the top panel of the tool casing has a guiding slot corresponding in position to the guiding track; and
the tool frame is disposed between the positioning protrusions of each pair and has
a guiding groove formed in the tool frame, and extending parallel to and engaging the guiding track of the tool casing; and
two engaging structures each respectively engaging one of the pairs of the positioning protrusions;
the slider is connected to the tool frame through the guiding slot of the top panel.

2. The mobile phone housing as claimed in claim 1, wherein
the partition panel of the tool casing has a lens aperture; and
the top panel of the tool casing has a lens aperture corresponding in position to the lens aperture of the partition panel.

3. The mobile phone housing as claimed in claim 1, wherein the tool frame is slidably mounted in and is selectively stored in the storing chamber of the tool casing, and the tool frame has
a nose hole;
two glass holes disposed oppositely beside the nose hole; and
two glasses respectively mounted in the glass holes.

4. The mobile phone housing as claimed in claim 1, wherein the tool frame is slidably mounted and selectively stored in the storing chamber of the tool casing, and the tool frame has
a mirror recess formed in the tool frame; and
a mirror securely mounted in the mirror recess.

5. The mobile phone housing as claimed in claim 4, wherein
the tool frame has a bottom surface facing the partition panel of the tool casing when the tool frame is stored in the storing chamber of the tool casing;
the mirror recess of the tool frame is formed in the bottom surface of the tool frame;
the top panel of the tool casing further has at least one leg recess formed in an outer surface of the top panel; and
the mobile phone housing further comprises at least one supporting leg mounted in the at least one leg recess of the top panel, and each of the at least one supporting leg has
a proximal portion pivotally connected to the top panel of the tool casing; and
a distal portion extending away from the side hole of the tool casing.

6. The mobile phone housing as claimed in claim 3, wherein
the tool frame further has
a front facing the side hole of the tool casing when the tool frame is stored in the tool casing;
a rear opposite to the front of the tool frame; and
two temples separately protruding from the rear of the tool frame;
the two engaging structures of the tool frame are respectively formed on the temples, and each engaging structure is disposed adjacent to a distal end of the temple.

7. The mobile phone housing as claimed in claim 4, wherein
the tool frame further has
a front facing the side hole of the tool casing when the tool frame is stored in the tool casing;
a rear opposite to the front of the tool frame; and
two temples separately protruding from the rear of the tool frame;
the two engaging structures of the tool frame are respectively formed on the temples, and each engaging structure is disposed adjacent to a distal end of the temple.

8. The mobile phone housing as claimed in claim 5, wherein
the tool frame further has
a front facing the side hole of the tool casing when the tool frame is stored in the tool casing;
a rear opposite to the front of the tool frame; and
two temples separately protruding from the rear of the tool frame;
the two engaging structures of the tool frame are respectively formed on the temples, and each engaging structure is disposed adjacent to a distal end of the temple.

9. The mobile phone as claimed in claim 6, wherein each of the engaging structures of the tool frame is a resilient panel having a recessed portion, and the recessed portions of the engaging structures of the tool frame each selectively engage or disengage from one of the pairs of the positioning protrusions.

10. The mobile phone as claimed in claim 7, wherein each of the engaging structures of the tool frame is a resilient panel having a recessed portion, and the recessed portions of the engaging structures of the tool frame each selectively engage or disengage from one of the pairs of the positioning protrusions.

11. The mobile phone as claimed in claim 8, wherein each of the engaging structures of the tool frame is a resilient panel having a recessed portion, and the recessed portions of the engaging structures of the tool frame each selectively engage or disengage from one of the pairs of the positioning protrusions.

* * * * *